United States Patent [19]

Lesmeister

[11] Patent Number: 4,902,986

[45] Date of Patent: Feb. 20, 1990

[54] PHASED LOCKED LOOP TO PROVIDE PRECISE FREQUENCY AND PHASE TRACKING OF TWO SIGNALS

[75] Inventor: Gary J. Lesmeister, Sunnyvale, Calif.

[73] Assignee: Asix Systems Corporation, Fremont, Calif.

[21] Appl. No.: 303,927

[22] Filed: Jan. 30, 1989

[51] Int. Cl.$^4$ .............................................. H03L 7/00
[52] U.S. Cl. .......................................... 331/25; 331/57
[58] Field of Search ........................... 331/1 A, 25, 57; 455/36

[56] References Cited

U.S. PATENT DOCUMENTS

4,417,246 11/1983 Agnor et al. .................. 455/343 X

Primary Examiner—Eugene R. LaRoche
Assistant Examiner—Robert J. Pascal
Attorney, Agent, or Firm—Thomas E. Schatzel

[57] ABSTRACT

A device and method are presented which allows the precise generation of signals within an integrated circuit that are calibrated to an external reference signal. The device consists of a ring oscillator which generates a calibration signal oscillating at a first frequency and a power source that supplies a compensated power signal to the ring oscillator. The first frequency is variable based on the voltage of the compensated power signal. A phase detector is used to detect the relative phase of the calibration signal and the external reference signal. The compensated power signal is also used for critical data paths within the integrated circuit where precise timing is required. In a tester, a plurality of signals may be extracted from the ring oscillator using a series of taps. These signals will oscillate at the same frequency as the calibration signal, but will be phase shifted. The signals may be combined with multiplexors to form a test signal which is applied to a device under test (DUT). Further, in order to make transparent propagation delay, delayed calibration signals may be generated.

14 Claims, 4 Drawing Sheets

Fig_1

Fig_2

Fig_4

Fig_5

PHASED LOCKED LOOP TO PROVIDE PRECISE FREQUENCY AND PHASE TRACKING OF TWO SIGNALS

BACKGROUND OF THE INVENTION

1. Field of the Invention

The present invention relates to a phased lock loop used on an integrated circuit to provide precise frequency and phase tracking of two signals.

2. Description of the Prior Art

In many applications, such as generating signals for testing integrated circuits, it is desirable to generate timing signals which have a great deal of precision. For example, some applications require two signals to be offset from one another by a predictable amount less than a nano second. Traditional means of generating signals with such precision have been very difficult and solutions have been very expensive.

Typically this type of precision in signal generation has not been available in many inexpensive integrated circuit technologies such as CMOS. This is because the process by which these integrated circuits are manufactured has not allowed for sufficient control of process parameters or the limiting of sensitivity to environmental factors so as to allow timing to be predicted at the degree of certainty required for such applications.

SUMMARY OF THE INVENTION

In accordance with the preferred embodiment of the present invention a device and method are presented which allows the precise generation of signals within an integrated circuit that are calibrated to an external reference signal. The device consists of a ring oscillator which generates a calibration signal oscillating at a first frequency and a power source that supplies a compensated power signal to the ring oscillator. The first frequency is variable based on the voltage of the compensated power signal. As the voltage of the compensated power signal is increased, the first frequency increases. As the voltage of the compensated power signal is decreased, the first frequency decreases. A phase detector is used to detect the relative phase of the calibration signal and the external reference signal. When the phase of the calibration signal is delayed relative to the phase of the external reference signal, the voltage of the compensated power signal is increased. When the phase of the external reference signal is delayed relative to the phase of the calibration signal the voltage of the compensated power signal is decreased. The compensated power signal is also used for compensating critical data paths within the integrated circuit where precise timing is required.

In a tester, a plurality of signals may be extracted from the ring oscillator using a series of taps. These signals will oscillate at the same frequency as the calibration signal, but will be phase shifted. The signals may be selected with multiplexers to form a test signal which is applied to a device under test (DUT).

In order to make other propagation delays both internal and external to the integrated circuit transparent, delayed calibration signals may be generated. For example, a first delayed calibration signal may be generated by delaying the calibration signal an amount equal to the propagation delay through the multiplexers and other circuitry within the integrated circuit. A second delayed calibration signal may be generated by delaying the first delayed calibration signal an amount equal to the amount of phase offset which results from the propagation delay of the test signal traveling from the integrated circuit to the DUT and returning from the DUT to the integrated circuit (the round trip delay).

These and other objects and advantages of the present invention will no doubt become obvious to those of ordinary skill in the art after having read the following detailed description of the preferred embodiment which is illustrated in the various drawing figures.

DESCRIPTION OF THE PREFERRED EMBODIMENT

Figure 1:
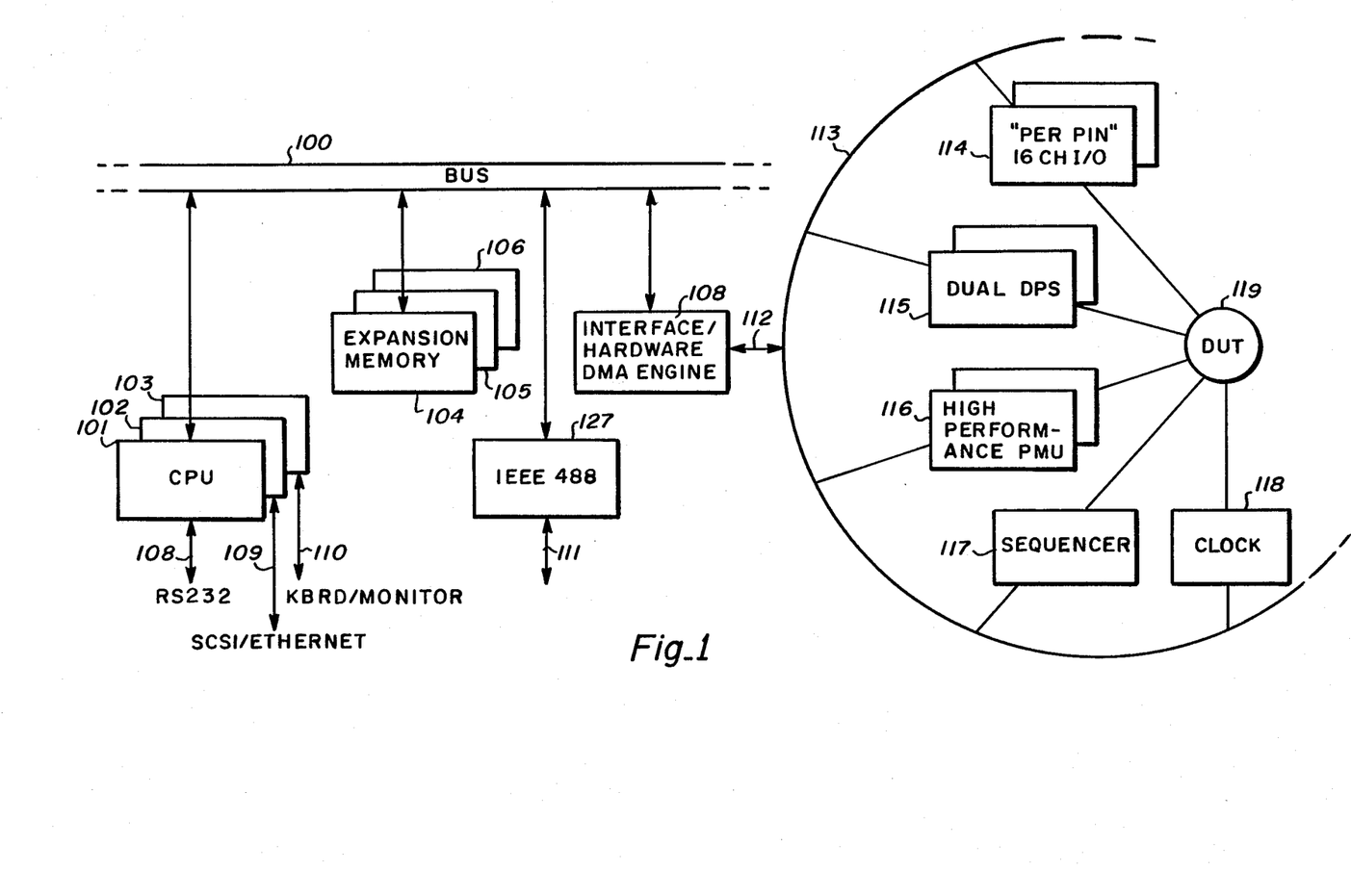
FIG. 1 shows a diagrammatical block diagram of an integrated circuit tester in accordance with the preferred embodiment of the present invention.

In FIG. 1 an integrated circuit tester is shown. A device under test (DUT) 119 is shown connected to a clock 118, a sequencer 117, one or more high performance precision measurement units (PMU) 116, one or more dual device power supplies (DPS) 115 and up to nineteen per pin sixteen channel input/output (16 CH I/O) cards 114. Clock 118, sequencer 117, PMU 116, DPS 115 and 16 CH I/O cards 114 are each coupled to a bus 113. Bus 113 is a modified 32-bit VME bus.

Interface hardware direct memory access (DMA) engine 108 serves as an interface between bus 113 and a bus 100. Bus 100 is an A32/D32 VME bus. To bus 100 may be connected various devices which provide the necessary processing power and interfaces to the integrated circuit tester. For example, in FIG. 1 a central processing unit (CPU) 101 providing an RS-232 connection 108, a CPU interface 102 providing a SCSI/ETHERNET interface 109, a CPU interface 103 providing an interface 110 for a keyboard and a monitor, an expansion memory board 104, an expansion memory board 105, an expansion memory board 106 and an IEEE 488 interface 107 providing connections 111 to peripheral devices are shown connected to bus 100.

Each of the 16 CH I/O cards 114 contain eight CMOS integrated circuits. Each of the eight CMOS integrated circuits has two channels, each channel generating signals for a signal pin of DUT 119.

Figure 2:
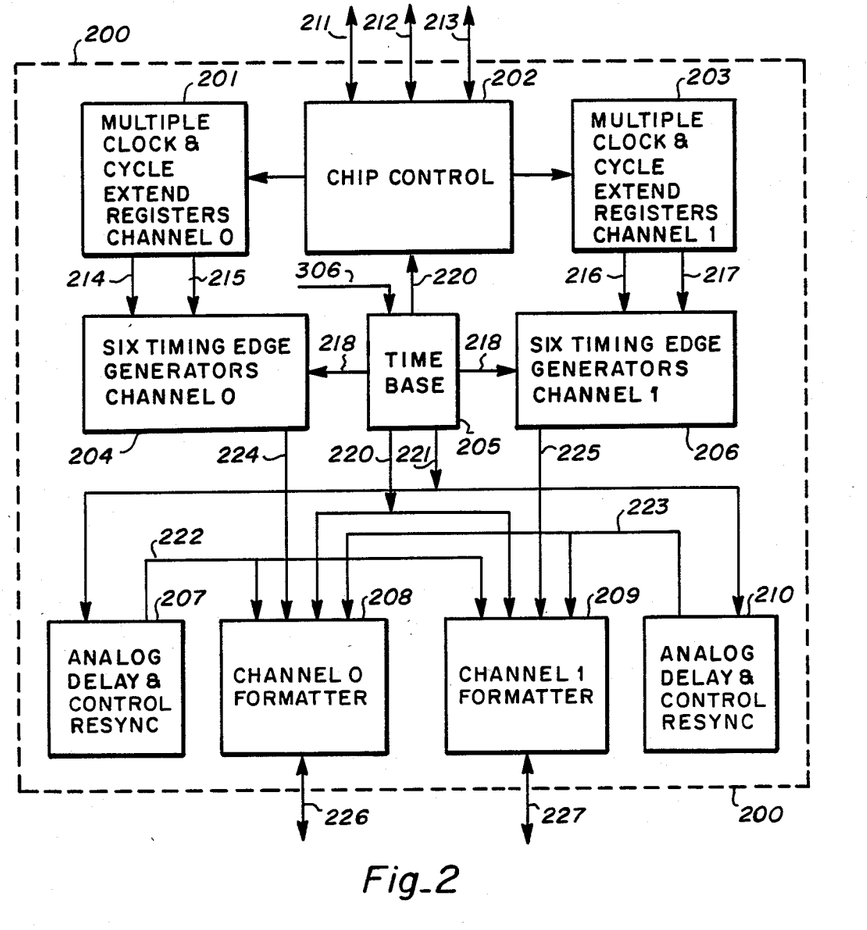
FIG. 2 shows a block diagram of an integrated circuit used to present signals to a device being tested by the integrated circuit tester of FIG. 1 in accordance with the preferred embodiment of the present invention.

FIG. 2 shows a block diagram of an integrated circuit 200 which is one of the CMOS integrated circuits which are part of a 16 CH I/O card 114. A chip control 202 is the major time generator for integrated circuit 200. Chip control 202 acts as an interface to bus 133 through lines 211, an interface to memory within 16 CH I/O card 114 through lines 212, and an interface to sequencer 117 through lines 213.

A time base 205 generates time signals for integrated circuit 200. Particularly, time base 205 produces a signal 220 which is a high frequency signal that is phased locked to an external reference oscillator signal 306. Time base 205 also generates a signal 221 which is a high frequency signal that is delay adjusted to occur just before signal 220. Finally, time base 205 generates thirty-one pulse generator outputs 218 for each cycle of signal 220.

Channel 0 includes multiple clock and cycle extend registers 201, six timing edge generators 204, analog delay and control resync 207 and formatter 208. Similarly, channel 1 includes multiple clock and cycle extend registers 203, six timing edge generators 206, analog delay and control resync 210 and formatter 209.

Multiple clock and cycle extend registers 201 receive input from chip control 202 which includes a clock signal based on signal 220. From the clock signal from chip control 202, multiple clock and cycle extend registers 201 generate multiple clocks 215 and a window mili signal 214.

Six timing edge generators 204 receives window mili signal 214 and multiple clocks 215 from multiple clock and cycle extend registers 201, and receives signals 218 from time base 205. Six timing edge generators 204 is able to combine mili signal 214 with one of multiplexed thirty-one pulse generator outputs 218, and provide for additional high resolution delay using 100 picosecond taps, and otherwise process signals before forwarding signals 224 to formatter 208.

Formatter 208 formats data for transfer through lines 226 to a pin of DUT 119. Also through lines 226 formatter 208 receives data from DUT 119.

Likewise, multiple clock and cycle extend registers 203 receive input from chip control 202 which includes a clock signal based on signal 220. From the clock signal from chip control 202, multiple clock and cycle extend registers 203 generate multiple clocks 216 and a window mili signal 217.

Six timing edge generators 206 receives window mili signal 217 and multiple clocks 216 from multiple clock and cycle extend registers 203, and receives signal 218 from time base 205. Six timing edge generators 206 is able to combine mili signal 217 with one of multiplexed thirty-one pulse generator outputs 218, and provide for additional high resolution delay using 100 picosecond taps, and otherwise process signals before forwarding signals 225 to formatter 209.

Formatter 209 formats data for transfer through lines 227 to a pin of DUT 119. Also through lines 227 formatter 209 receives data from DUT 119.

Analog delay and control resync 207 and analog delay and control resync 210 provide delay to data paths external to integrated circuit 200 in order to compensate for delays caused by transmission of signals from integrated circuit 200 to DUT 119 and from DUT 119 back to integrated circuit 200.

Analog delay and control resync 207 produces a signal 222. Signal 222 has the same frequency as signal 306, but is phase offset under program control from signal 218 by the amount of phase offset caused by the round trip signal for a signal from integrated circuit 200 to DUT 119. That is, the time it takes a signal to travel from integrated circuit 200 to DUT 119 and back is several cycles of signal 306 plus an analog remainder. Signal 222 is phase offset from signal 218 by this analog remainder.

Analog delay and control resync 210 produces a signal 223. Signal 223 is delay adjusted to occur just before signal 222. Signal 223 is used to bring all internal response control data from memory, major time subsystem, and external format sequencers earlier than signal 218. The reason for the early data phase shift to the format sequencers is so that the generated signal, when brought out for examination, may appear to the examiner to be zero phase shifted from signal 218 and signal 306.

Figure 3:
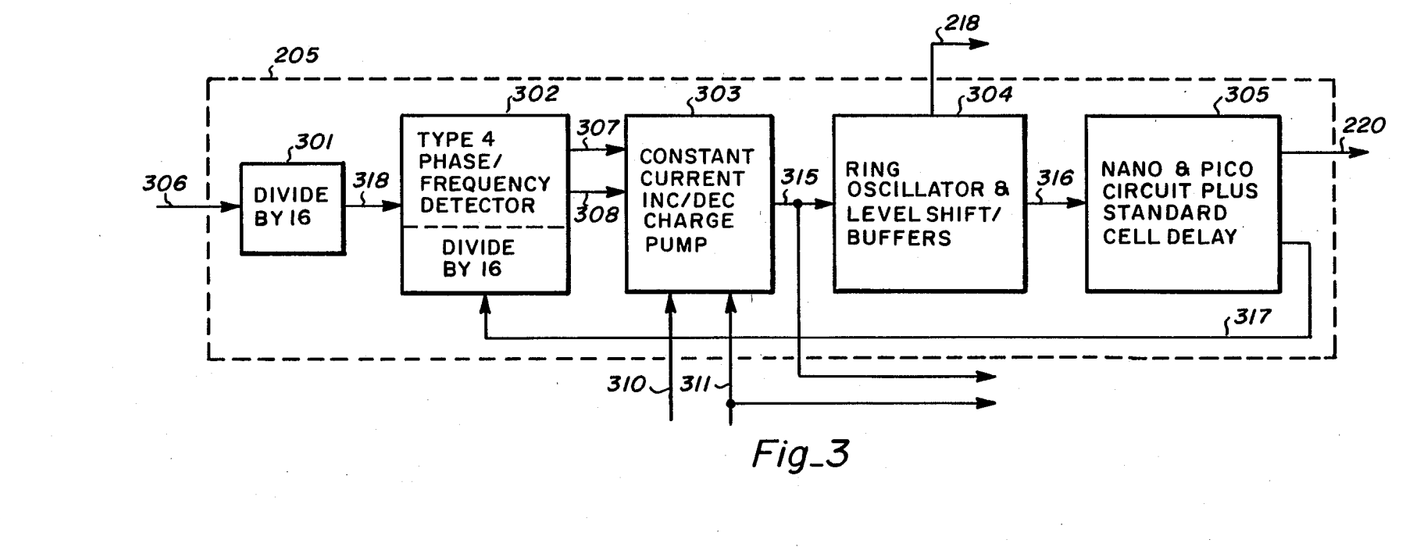
FIG. 3 shows a block diagram of a phased lock loop within the integrated circuit shown in FIG. 2 in accordance with the preferred embodiment of the present invention.

FIG. 3 is a block diagram of time base 205. Time base 205 produces signal 220 and phase locks signal 220 to external reference oscillator signal 306. External reference oscillator signal 306 is used for all integrated circuits within 16 CH I/O boards 114. In this way all integrated circuits within CH I/O boards 114 may be synchronized and the frequency of test signals sent to DUT 119 may be accurately controlled.

A divide by 16 block 301 receives external reference oscillator signal 306. Divide by 16 block 301 produces signal 318, which is a signal oscillating at exactly one sixteenth the frequency of external reference oscillator signal 306.

A type 4 phase/frequency detector 302 receives a signal 318. Type 4 phase/frequency detector 302 acts as part of a phased locked loop. A phased locked loop is a specific form of closed loop feedback system that provides precise frequency and phase tracking of two signals. The phased lock within time base 205 includes a reference signal—signal 318—some form of error or difference detector—type 4 phase/frequency detector 302—and a controllable generator that responds to the error or difference signal. A constant current INC/DEC charge pump 303 acts as the controllable generator for the phase locked loop. Divide by 16 block 301, type 4 phase/frequency detector 302 and constant current INC/DEC charge pump 303 form a comparator 401 shown in FIG. 4.

Type 4 phase/frequency detector produces an increment signal 307 and a decrement signal 308. Constant current INC/DEC charge pump 303, on the basis of these signals, increments or decrements the voltage of a compensated power signal 315. Constant current INC/DEC charge pump 303 also receives an input analog power signal 310 and analog ground signal 311 which are also used to generate compensated power signal 315.

Figure 5:
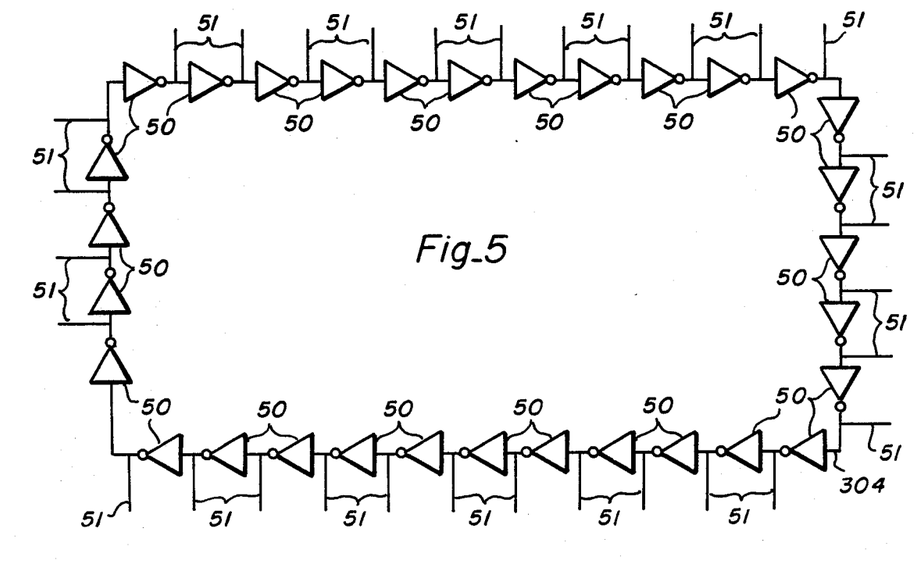
FIG. 5 shows implementation detail of a ring oscillator shown in FIG. 3.

Compensated power signal 315 is used as a power source for a ring oscillator. Ring oscillator 304 consists of a loop of thirty-one logical inverter gates 50, as shown in FIG. 5. Each logical inverter gate has as its power source compensated power signal 315. As the voltage of compensated power signal 315 is increased, the performance speed of each logical inverter gate 50 is increased, and the frequency of oscillation of ring oscillator 304 is increased. As the voltage of compensated power signal 315 is decreased, the performance speed of each logical inverter gate 50 is decreased, and the frequency of oscillation of ring oscillator 304 is decreased.

The output of each logical inverter is tapped by taps 51, shown in FIG. 5, and level shifted to produce thirty-one pulse generator outputs 218. Ring oscillator 304 also produces a control signal 316 which is used by a nano and pico circuit plus standard cell delay 305 to generate signal 220 and feedback signal 317. Signal 220 is phase locked to external reference oscillator signal 306. Feedback signal 317 oscillates at the same frequency as signal 220; however, feedback signal 317 is skewed from signal 220 and is used as feedback to type 4 phase/frequency detector 302. A divide by 16 portion of type 4 phase/frequency detector 302 reduces the frequency of feedback signal 317 to produce a signal that may be matched to signal 318.

When the signals received by 4 phase/frequency detector 302 are out of phase, type 4 phase/frequency detector, through increment signal 307 or decrement signal 308 will cause constant current INC/DEC charge pump 303 to increase or decrease compensated power signal 315, thereby increasing or decreasing the frequency of oscillation of ring oscillator 304, which changes the frequency/phase of feedback signal 317 bringing the signals received by tape 4 phase/frequency detector 302 back in phase.

Current fabrication processes which produce various types of integrated circuits, for example those used to produce CMOS integrated circuits, result in a wide variance of the speed of operation between integrated circuits. However, within any particular integrated circuit, the performance of gates is fairly uniform.

Gates within ring oscillator 304 need to operate at a known speed in order for signal 220 to be phase locked to external reference signal 306. The voltage of compensated power signal 315 that causes signal 220 to be phase locked to external reference signal 315 causes the gates within ring oscillator 304 to operate at this known speed. Since the speed at which gates operate is fairly uniform across integrated circuit 200, other gates will also operate at or very close to the known speed when powered by compensated power signal 315. Therefore, compensated power signal 315 may be used to power other gates within integrated circuit 200 in critical data paths, that is, gates in data paths where it is critical to know the time of propagation of a signal through the gates within the data path.

Figure 4:
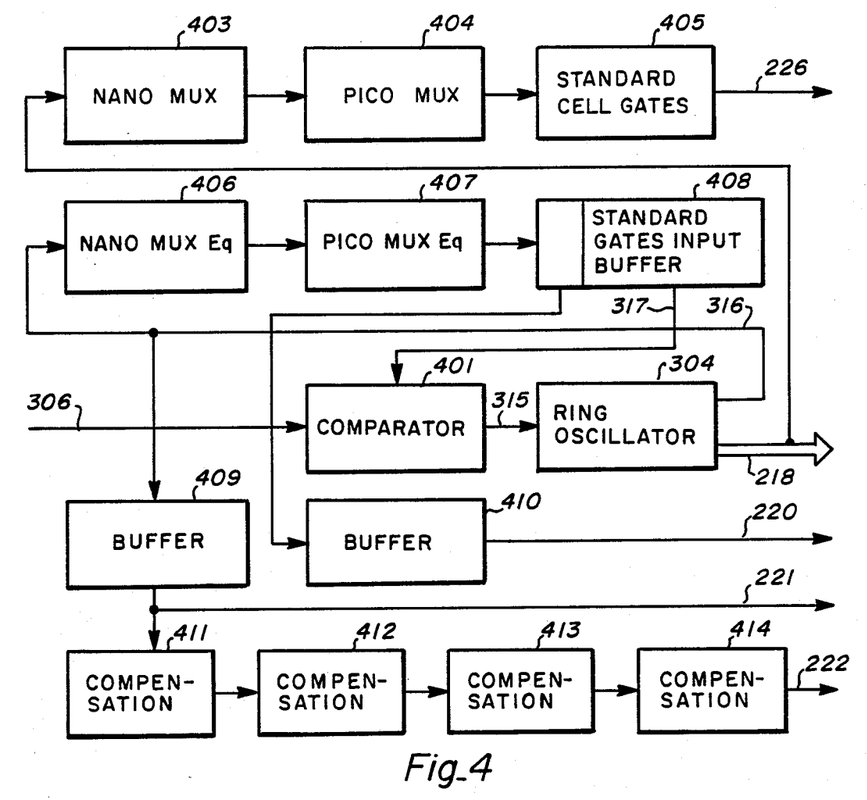
FIG. 4 shows a block diagram of various data paths within the integrated circuit which are used for generating compensated delay according to the preferred embodiment of the present invention.

FIG. 4 illustrates how signals within integrated circuit 200 compensate for delay. Any of thirty-one pulse generator outputs 218 selected to be placed on lines 226 for transfer to DUT 119 typically pass through a nano multiplexer 403, a pico multiplexer 404 and standard cell gates 405 which are within six edge generators 204 and formatter 208. Each of nano multiplexer 403, pico multiplexer 404 and standard cell gates 405 causes a delay. In order that signal 220 may be in phase with signals that are sent to DUT 119, after exiting ring oscillator 304, signal 316 is placed through an equivalent delay 406 of nano multiplexer 403, an equivalent delay 407 of pico multiplexer 404, an equivalent delay of 408 of standard cell gates 405, and a buffer 410 which takes into account transmission delay from integrated circuit 200 to DUT 119.

As shown in FIG. 4, signal 317 is further delayed by equivalent circuit 408 before being fed back to comparator 401. Compensation circuit 411, compensation circuit 412, compensation circuit 413 and compensation circuit 414 within analog delay 207 are used to provide additional delay in the production of signal 222.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted s covering all alterations and modifications as fall within the true spirit and scope of the invention.

I claim:

1. A device for use within an integrated circuit and which utilizes an external reference oscillating signal to calibrate signals within the integrated circuit, the device comprising:
   a ring oscillator for generating a calibration signal oscillating at a first frequency which is to be matched to the frequency of oscillation of the external reference oscillating signal;
   a power source for supplying a compensated power signal to the ring oscillator, the frequency of oscillation of said calibration signal increasing when the voltage of said compensated power signal is increased, and the frequency of oscillation of said calibration signal decreasing when the voltage of said compensated power signal is decreased, the voltage of said compensated power signal being responsive to a control signal; and
   phase detector means, coupled to the power source, for receiving as input said calibration signal and said reference oscillating signal and for generating said control signal, the phase detector means varying said control signal so that said first frequency matches the frequency of oscillation of the external reference oscillating signal;
   wherein said compensated power signal is used in other portions of the integrated circuit which are critical data paths.

2. A device for use within an integrated circuit and which utilizes an external reference oscillating signal to calibrate signals within the integrated circuit, the device comprising:
   a ring oscillator for generating a calibration signal oscillating at a first frequency which is to be matched to the frequency of oscillation of the external reference oscillating signal;
   a power source for supplying a compensated power signal to the ring oscillator, the frequency of oscillation of said calibration signal increasing when the voltage of said compensated power signal is increased, and the frequency of oscillation of said calibration signal decreasing when the voltage of said compensated power signal is decreased, the voltage of said compensated power signal being responsive to a control signal;
   phase detector means, coupled to the power source, for receiving as input said calibration signal and said reference oscillating signal and for generating said control signal, the phase detector means varying said control signals so that said first frequency matches the frequency of oscillation of the external reference oscillating signal; and
   a plurality of taps, each tap coupled to said ring oscillator at a different location of said ring oscillator each tapping said ring oscillator so as to generate a signal which is phase shifted from said calibration signal.

3. An integrated circuit for use within a tester of a first device and which integrated circuit utilizes an external reference oscillating signal to calibrate signals generated within the integrated circuit for transfer to the first device, the integrated circuit comprising:
   a ring oscillator for generating a calibration signal oscillating at a first frequency which is to be matched to the frequency of oscillation of said external reference oscillating signal;
   a power source that supplies a compensated power signal to the ring oscillator, the frequency of oscillation of said calibration signal increasing when the voltage of said compensated power signal is increased, and the frequency of oscillation of said calibration signal decreasing when the voltage of said compensated power signal is decreased, the voltage of said compensated power signal being responsive to a control signal; and phase detector means, coupled to the power source, for receiving as input said calibration signal and said reference oscillating signal and for generating said control signal, the phase detector means varying said control signal so that the first frequency matches the frequency of oscillation of said external reference oscillating signal;

wherein said compensated power signal is used in other portions of the integrated circuit which are critical data paths.

4. An integrated circuit for use with a tester of a first device and which integrated circuit utilizes an external reference oscillating signal to calibrate signals generated within the integrated circuit for transfer to the first device, the integrated circuit comprising:

a ring oscillator for generating a calibration signal oscillating at a first frequency which is to be matched to the frequency of oscillation of said external reference oscillating signal;

a power source that supplies a compensated power signal to the ring oscillator, the frequency of oscillation of said calibration signal increases when the voltage of said compensated power signal is increased, and the frequency of oscillation of said calibration signal decreasing when the voltage of said compensated power signal is decreased, the voltage of said compensated power signal being responsive to a control signal;

phase detector means, coupled to the power source, for receiving as input said calibration signal and said reference oscillating signal and for generating said control signal, the phase detector means varying said control signal so that the first frequency matches the frequency of oscillation of said external reference oscillating signal; and a plurality of taps, each tap coupled to the ring oscillator at a different location of the ring oscillator each tapping the ring oscillator so as to generate a first plurality of signals which are phase shifted from said calibration signal.

5. The integrated circuit of claim 4 further comprising:

a plurality of multiplexers coupled to said first plurality of signals for generating a test signal for transmission to the first device.

6. The integrated circuit of claim 5 further comprising:

first delay means, to which said calibration signal is applied, for generating a first delayed calibration signal, the phase of said first delayed calibration signal being offset from the phase of said calibration signal by the amount of propagation delay through said plurality of multiplexers.

7. The integrated circuit of claim 6 additionally comprising:

second delay means, to which said first delayed calibration signal is applied, for generating a second delayed calibration signal, the phase of said second delayed calibration signal being additionally offset from the phase of said calibration signal to account for the amount of propagation delay that occurs when said test signal is sent from the integrated circuit to the first device and is returned from the first device to the integrated circuit.

8. A method for calibrating signals generated by an integrated circuit to an external reference oscillating signal, the method comprising the following steps:

a. generating a calibration oscillation signal using a first plurality of gates within the integrated circuit;

b. varying the voltage of a power signal supplying power to said first plurality of gates in order to match the frequency of oscillation of said calibration oscillating signal to the frequency of oscillation of said external reference oscillating signal; and c. using said power signal in other portions of the integrated circuit which are critical data paths.

9. The method of claim 8 wherein, said first plurality of gates is arranged in the shape of a ring oscillator.

10. The method of claim 8 wherein, step (b) comprises the substeps of:

b1. dividing said external reference oscillating signal and said calibration oscillating signal to generate respectively a divided external reference oscillating signal and a divided calibration oscillating signal;

b2. increasing the voltage of said power signal when said divided calibration oscillating signal is delayed in phase relative to said divided external reference oscillating signal; and b3. decreasing the voltage of said power signal when said divided external reference oscillating signal is delayed in phase relative to said calibration oscillating signal.

11. The method for generating calibrated signals within an integrated circuit for application within a tester which tests a first device, the method comprising the following steps:

a. generating a calibration oscillating signal using a first plurality of inverters forming a ring oscillator; and b. varying the voltage of a power signal supplying power to said first plurality of inverters in order to match the frequency of oscillation of said calibration oscillating signal to the frequency of oscillation of an external reference oscillating signal;

c. tapping an output of each of said first plurality of inverters to produce a first plurality of signals; and d. multiplexing said first plurality of signals with a plurality of multiplexors to produce a test signal for application to said first device.

12. The method of claim 11 further comprising the step of:

e. generating a first delayed calibration signal by delaying said calibration signal an amount equal to the propagation delay through said plurality of multiplexors.

13. The method of claim 12 further comprising the step of:

f. generating a second delayed calibration signal by delaying the phase of said first delayed calibration signal an amount equal to the amount of phase offset which results from the propagation delay of said test signal traveling from the integrated circuit to said first device and returning from said first device to the integrated circuit.

14. The method of claim 11 wherein, step (b) comprises the substeps of:

b1. dividing said external reference oscillating signal and said calibration oscillating signal to generate respectively a divided external reference oscillating signal and a divided calibration oscillating signal;

b2. increasing the voltage of said power signal when said divided calibration oscillating signal is delayed in phase relative to said divided external reference oscillating signal; and b3. decreasing the voltage of said power signal when said divided external reference oscillating signal is delayed in phase relative to said calibration oscillating signal.

* * * * *

REEXAMINATION CERTIFICATE (3617th)

United States Patent [19]
Lesmeister

[11] B1 4,902,986
[45] Certificate Issued Sep. 1, 1998

[54] PHASED LOCKED LOOP TO PROVIDE PRECISE FREQUENCY AND PHASE TRACKING OF TWO SIGNALS

[75] Inventor: Gary J. Lesmeister, Sunnyvale, Calif.

[73] Assignee: Credence Systems Corporation, Fremont, Calif.

Reexamination Request:
No. 90/004,845, Nov. 13, 1997

Reexamination Certificate for:
Patent No.: 4,902,986
Issued: Feb. 20, 1990
Appl. No.: 303,927
Filed: Jan. 30, 1989

[51] Int. Cl.$^6$ .................................................. H03L 7/00
[52] U.S. Cl. ........................... 331/25; 331/45; 331/57; 331/60
[58] Field of Search ........................ 331/25, 45, 57, 331/60

[56] References Cited

U.S. PATENT DOCUMENTS

| | | | |
|---|---|---|---|
| 4,346,343 | 8/1982 | Berndlmaier | 323/282 |
| 4,584,695 | 4/1986 | Wong et al. | 375/327 |
| 4,641,048 | 2/1987 | Pollock | 327/262 |

FOREIGN PATENT DOCUMENTS 0 046 482   3/1982   European Pat. Off. .

OTHER PUBLICATIONS

D-K Jeong, G. Borriello, D. Hodges and R. Katz, *Design of PLL–Based Clock Generation Circuits*, IEEE Journal of Solid–State Circuits, vol. SC–22, No. 2, Apr. 1987, 255–261 (Jeong et al).

*Primary Examiner*—S. H. Grimm

[57] ABSTRACT

A device and method are presented which allows the precise generation of signals within an integrated circuit that are calibrated to an external reference signal. The device consists of a ring oscillator which generates a calibration signal oscillating at a first frequency and a power source that supplies a compensated power signal to the ring oscillator. The first frequency is variable based on the voltage of the compensated power signal. A phase detector is used to detect the relative phase of the calibration signal and the external reference signal. The compensated power signal is also used for critical data paths within the integrated circuit where precise timing is required. In a tester, a plurality of signals may be extracted from the ring oscillator using a series of taps. These signals will oscillate at the same frequency as the calibration signal, but will be phase shifted. The signals may be combined with multiplexors to form a test signal which is applied to a device under test (DUT). Further, in order to make transparent propagation delay, delayed calibration signals may be generated.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-3, 5 and 9 are cancelled.

Claims 4, 6, 8 and 11 are determined to be patentable as amended.

Claims 7, 10 and 12-14, dependent on an amended claim, are determined to be patentable.

4. An integrated circuit for use with a tester of a first device and which integrated circuit utilizes an external reference oscillating signal to calibrate signals generated within the integrated circuit for transfer to the first device, the integrated circuit comprising:
   a ring oscillator for generating a calibration signal oscillating at a first frequency which is to be matched to the frequency of oscillation of said external reference oscillating signal;
   a power source that supplies a compensated power signal to the ring oscillator, the frequency of oscillation of said calibration signal increases when the voltage of said compensated power signal is increased, and the frequency of oscillation of said calibration signal decreasing when the voltage of said compensated power signal is decreased, the voltage of said compensated power signal being responsive to a control signal;
   phase detector means, coupled to the power source, for receiving as input said calibration signal and said reference oscillating signal and for generating said control signal, the phase detector means varying said control signal so that the first frequency matches the frequency of oscillation of said external reference oscillating signal; [and]
   a plurality of taps, each tap coupled to the ring oscillator at a different location of the ring oscillator each tapping the ring oscillator so as to generate a first plurality of signals which are phase shifted from said calibration signal; *and*
   *a plurality of multiplexers coupled to said first plurality of signals for generating a test signal for transmission to the first device.*

6. The integrated circuit of claim [5] *4* further comprising:
   first delay means, to which said calibration signal is applied, for generating a first delayed calibration signal, the phase of said first delayed calibration signal being offset from the phase of said calibration signal by the amount of propagation delay through said plurality of multiplexers.

8. A method for calibrating signals generated by an integrated circuit to an external reference oscillating signal, the method comprising the following steps:
   a. generating a calibration oscillation signal using a first plurality of gates within the integrated circuit, *said first plurality of gates being arranged in the shape of a ring oscillator*;
   b. varying the voltage of a power signal supplying power to said first plurality of gates in order to match the frequency of oscillation of said calibration oscillating signal to the frequency of oscillation of said external reference oscillating signal; [and]
   c. using said power signal in other portions of the integrated circuit which are critical data paths;
   *d. tapping an output of each of said first plurality of gates to produce a first plurality of signals; and*
   *e. multiplexing said first plurality of signals to produce an output signal.*

11. [The] *A* method for generating calibrated signals within an integrated circuit for application within a tester which tests a first device, the method comprising the following steps:
   a. generating a calibration oscillating signal using a first plurality of inverters forming a ring oscillator; [and]
   b. varying the voltage of a power signal supplying power to said first plurality of inverters in order to match the frequency of oscillation of said calibration oscillating signal to the frequency of oscillation of an external reference oscillating signal;
   c. tapping an output of each of said first plurality of inverters to produce a first plurality of signals; and
   d. multiplexing said first plurality of signals with a plurality of multiplexers to produce a test signal for application of said first device.

* * * * *